United States Patent
Liang et al.

(10) Patent No.: US 12,034,197 B2
(45) Date of Patent: Jul. 9, 2024

(54) RF TRANSMISSION LINE COMPRISING AT LEAST ONE BAND-SHAPED LINE SEGMENT COUPLED TO AT LEAST TWO COPLANAR WAVEGUIDE SEGMENTS IN AN EXTENDING DIRECTION

(71) Applicant: BEIJING XIAOMI MOBILE SOFTWARE CO., LTD., Beijing (CN)

(72) Inventors: Peiyu Liang, Beijing (CN); Tianbo Liu, Beijing (CN); Mengtian Mu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 156 days.

(21) Appl. No.: 17/853,232

(22) Filed: Jun. 29, 2022

(65) Prior Publication Data
US 2023/0268629 A1 Aug. 24, 2023

(30) Foreign Application Priority Data
Feb. 18, 2022 (CN) .......................... 202210153026.4

(51) Int. Cl.
*H01P 5/02* (2006.01)
*H01P 1/06* (2006.01)
(Continued)

(52) U.S. Cl.
CPC .............. *H01P 5/028* (2013.01); *H01P 1/064* (2013.01); *H01P 3/003* (2013.01); *H01P 3/026* (2013.01);
(Continued)

(58) Field of Classification Search
CPC .......... H01P 3/003; H01P 3/006; H01P 1/064; H01P 5/028
(Continued)

(56) References Cited

U.S. PATENT DOCUMENTS 6,885,549 B2 * 4/2005 Thomason ............. H05K 1/028
174/268
7,432,779 B2 * 10/2008 Kim et al. .............. H01P 3/081
333/33
(Continued)

OTHER PUBLICATIONS

European Patent Application No. 22181317.3, Search and Opinion dated Nov. 25, 2022, 10 pages.

*Primary Examiner* — Benny T Lee
(74) *Attorney, Agent, or Firm* — Cozen O'Connor

(57) ABSTRACT

An electronic device includes a first body and a second body rotatably connected relative to each other through a pivot shaft having a metal portion, the first body including a first motherboard, the second body including a second motherboard; and a radio-frequency transmission line including at least one band-shaped line segment and at least two coplanar waveguide segments, the band-shaped line segment being coupled to the coplanar waveguide segments, in which one band-shaped line segment is located between two coplanar waveguide segments in an extending direction of the radio-frequency transmission line, the one band-shaped line segment is coupled to the pivot shaft to retain stationary relative to the pivot shaft, and the coplanar waveguide segments are spaced apart from the metal portion. The radio-frequency transmission line has a first end coupled to the first motherboard, and a second end coupled to the second motherboard.

20 Claims, 5 Drawing Sheets

(51) Int. Cl.
    *H01P 3/00*      (2006.01)
    *H01P 3/02*      (2006.01)
    *H01P 5/08*      (2006.01)
    *H05K 1/14*      (2006.01)

(52) U.S. Cl.
    CPC ............... *H01P 5/08* (2013.01); *H05K 1/148* (2013.01); *H05K 2201/10189* (2013.01)

(58) Field of Classification Search
    USPC ........................................................ 333/246
    See application file for complete search history.

(56) References Cited

U.S. PATENT DOCUMENTS

| | | |
|---|---|---|
| 10,833,397 B2 | 11/2020 | Lee et al. |
| 2012/0235764 A1* | 9/2012 | Kang et al. ......... H05K 1/0253 29/846 |
| 2021/0288390 A1 | 9/2021 | Tago |

* cited by examiner

RF TRANSMISSION LINE COMPRISING AT LEAST ONE BAND-SHAPED LINE SEGMENT COUPLED TO AT LEAST TWO COPLANAR WAVEGUIDE SEGMENTS IN AN EXTENDING DIRECTION

CROSS-REFERENCE TO RELATED APPLICATIONS

The present application claims the benefit of priority to Chinese Application No. 202210153026.4, filed on Feb. 18, 2022, the content of which is incorporated herein by reference in its entirety for all purposes.

TECHNICAL FIELD

The present disclosure relates to a field of electronic devices, and more particularly to an electronic device and its radio-frequency transmission line.

BACKGROUND

Antennas of electronic devices that cannot be folded are arranged as metal frames around the electronic devices. For foldable 5G electronic devices, a pivot shaft is arranged at a side of the electronic device in a folded state.

SUMMARY OF THE INVENTION

An electronic device according to certain embodiments of the present disclosure includes a first body and a second body rotatably connected relative to each other through a pivot shaft having metal portion, the first body including a first motherboard, the second body including a second motherboard; and a radio-frequency transmission line having a first end coupled to the first motherboard and a second end coupled to the second motherboard, the radio-frequency transmission line including at least one band-shaped line segment and at least two coplanar waveguide segments, the band-shaped line segment being coupled to the coplanar waveguide segments, in which one band-shaped line segment is located between two coplanar waveguide segments in an extending direction of the radio-frequency transmission line, one band-shaped line segment is coupled to the pivot shaft to retain stationary relative to the pivot shaft, and the coplanar waveguide segments are spaced apart from the metal portion.

A radio-frequency transmission line according to certain embodiments of the present disclosure includes: at least one band-shaped line segment and at least two coplanar waveguide segments, one band-shaped line segment is located between two coplanar waveguide segments in an extending direction of the radio-frequency transmission line, the band-shaped line segment being coupled to the coplanar waveguide segments.

DETAILED DESCRIPTION OF THE INVENTION

Embodiments of the present disclosure will be described in detail below, and examples of the embodiments are shown in accompanying drawings, where like features have been denoted by the same reference label throughout the detail description of the drawings. The embodiments described herein with reference to drawings are explanatory, illustrative, and used to generally understand the present disclosure. The embodiments shall not be construed to limit the present disclosure.

For foldable 5G electronic devices, a pivot shaft is arranged at a side of the electronic device in a folded state, thus antennas can only be arranged at the other three sides of the electronic device in the folded state. Such an antenna arrangement cannot meet the needs of multiple frequency bands.

In order to enable the foldable 5G electronic devices to operate in multiple frequency bands, several antennas need to be arranged at two sides of the pivot shafts of the electronic devices, and thus radio-frequency transmission lines need to pass through the pivot shafts. Existing foldable 5G electronic devices have defects of discontinuous impedance of the radio-frequency transmission lines.

Figure 1:
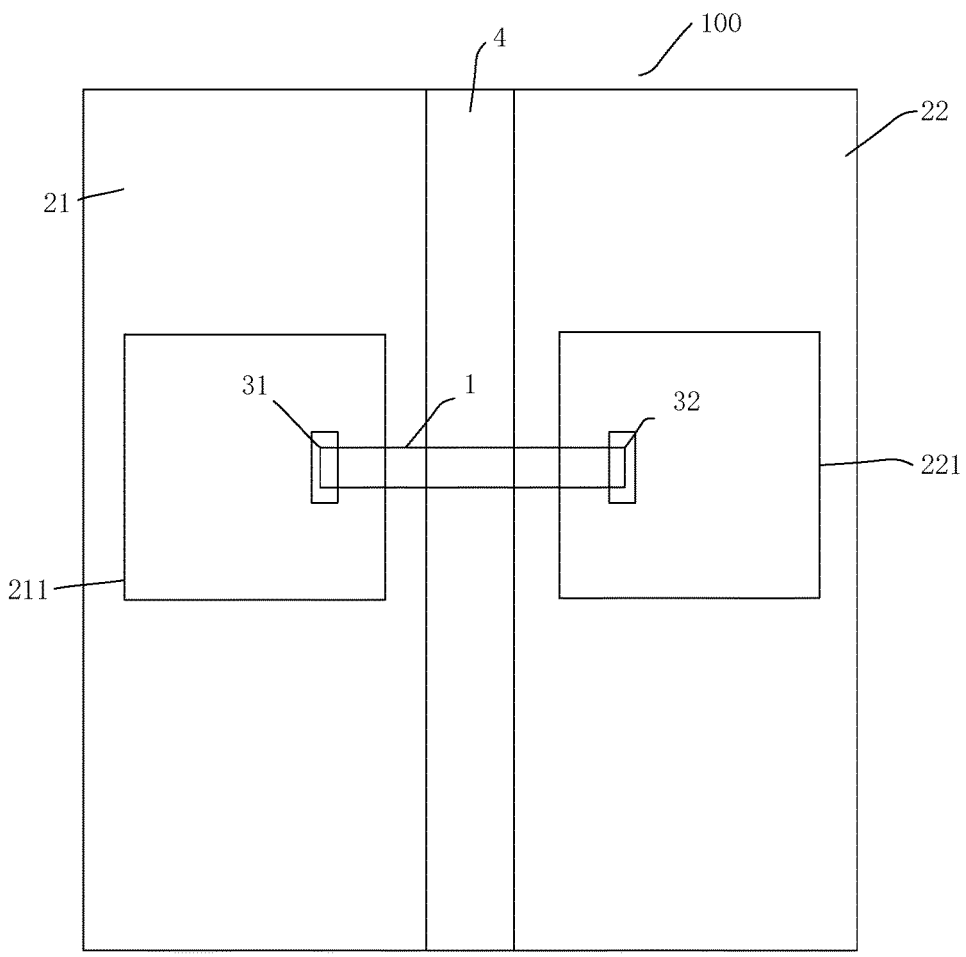
FIG. 1 is a schematic view of an electronic device according to an embodiment of the present disclosure.

An electronic device 100 according to certain embodiments of the present disclosure will be described below with reference to the drawings. As illustrated in FIG. 1, the electronic device 100 according to certain embodiments of the present disclosure includes a first body 21, a second body 22, and a radio-frequency transmission line 1.

The first body 21 and the second body 22 are rotatably connected relative to each other through a pivot shaft 4. That is, the first body 21 and the second body 22 are pivotally connected through the pivot shaft 4. That is to say, it is possible to keep the first body 21 still and rotate the second body 22, it is also possible to keep the second body 22 still and rotate the first body 21, and it is further possible to rotate both the first body 21 and the second body 22. The first body 21 includes a first motherboard 211, and the second body 22 includes a second motherboard 221.

Figure 2:
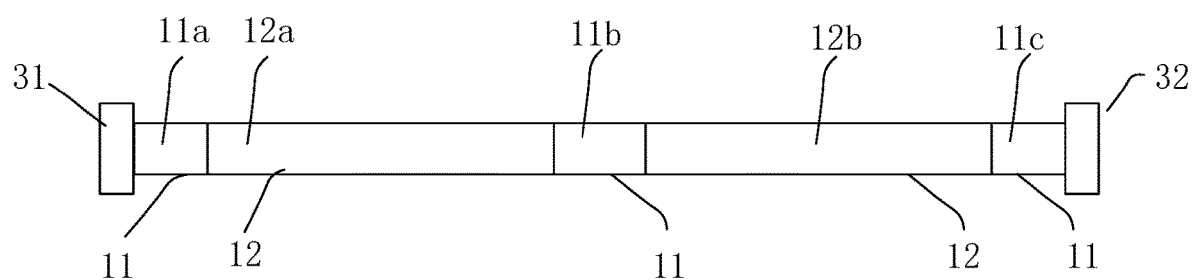
FIG. 2 is a schematic view of a radio-frequency transmission line according to an embodiment of the present disclosure.
Figure 5:
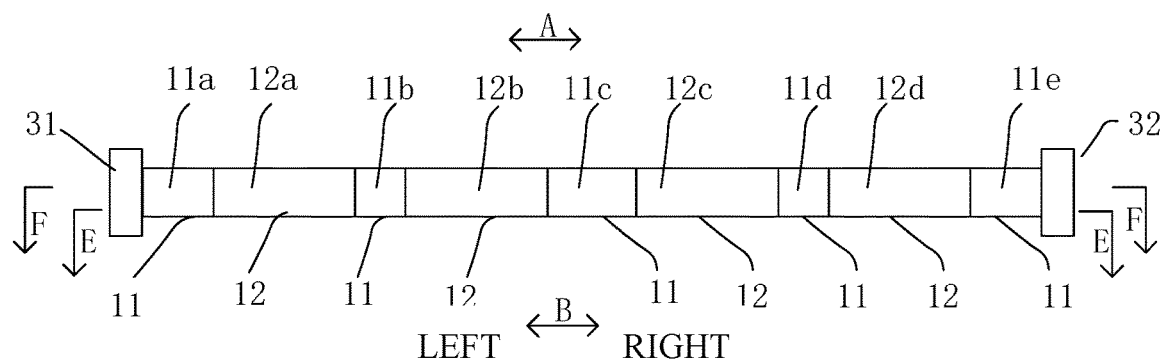
FIG. 5 is a schematic view of a radio-frequency transmission line according to another embodiment of the present disclosure.

A first end of the radio-frequency transmission line 1 is coupled to the first motherboard 211, and a second end of the radio-frequency transmission line 1 is coupled to the second motherboard 221. As illustrated in FIGS. 2 and 5, the radio-frequency transmission line 1 includes at least one band-shaped line segment 11 and at least two coplanar waveguide segments 12, and the band-shaped line segment 11 is coupled to the coplanar waveguide segments 12. One band-shaped line segment 11 is located between two coplanar waveguide segments 12 in an extending direction of the radio-frequency transmission line 1. One band-shaped line segment 11 is coupled to the pivot shaft 4 to retain stationary relative to the pivot shaft 4. For example, the one band-shaped line segment 11 may be adhered to the pivot shaft 4, or the one band-shaped line segment 11 may be coupled to the pivot shaft 4 through a snap or a snapping slot. The coplanar waveguide segments 12 are spaced apart from a metal portion of the pivot shaft 4.

When at least one of the first body 21 and the second body 22 is rotated, the radio-frequency transmission line 1 is bent. If the whole radio-frequency transmission line employs a band-shaped line structure, a metal ground layer of the radio-frequency transmission line will break after several bends, resulting in discontinuous impedance of the radio-frequency transmission line. If the whole radio-frequency transmission line employs a coplanar waveguide structure, a portion of the radio-frequency transmission line is covered by the metal portion of the pivot shaft, resulting in discontinuous impedance of the radio-frequency transmission line.

In the electronic device 100 according to embodiments of the present disclosure, one band-shaped line segment 11 of the radio-frequency transmission line 1 is coupled to the pivot shaft 4, and hence the one band-shaped line segment 11 may be retained stationary relative to the pivot shaft 4. Thus, when the radio-frequency transmission line 1 is bent (at least one of the first body 21 and the second body 22 is rotated), the one band-shaped line segment 11 will not bent, to prevent a metal ground layer of the one band-shaped line segment 11 from breaking after several bends and further avoid discontinuous impedance of the band-shaped line segment 11.

In the electronic device 100 according to embodiments of the present disclosure, the coplanar waveguide segments 12 are spaced apart from the metal portion of the pivot shaft 4, thus the coplanar waveguide segments 12 may be prevented from being covered by the metal portion of the pivot shaft 4, to avoid discontinuous of the coplanar waveguide segments 12. For example, the coplanar waveguide segment 12 may not be opposite to the metal portion of the pivot shaft 4, to be spaced apart from the metal portion of the pivot shaft 4. Additionally, a spacer layer (e.g., a foam layer) may be arranged between the coplanar waveguide segment 12 and the pivot shaft 4, and thus the coplanar waveguide segment 12 is spaced apart from the metal portion of the pivot shaft 4.

Therefore, the radio-frequency transmission line 1 according to embodiments of the present disclosure has advantages of continuous impedance after several bends, high signal transmission quality after bending and the like, and can apply to foldable electronic device. The electronic device 100 according to embodiments of the present disclosure has advantages of continuous impedance after several bends of the radio-frequency transmission line, high signal transmission quality after bending of the radio-frequency transmission line and the like.

As illustrated in FIG. 1, the electronic device 100 according to embodiments of the present disclosure includes a first body 21, a second body 22, and a radio-frequency transmission line 1. The first body 21 and the second body 22 are rotatably connected relative to each other through a pivot shaft 4. The electronic device 100 according to embodiments of the present disclosure is a foldable electronic device. For example, the electronic device 100 according to embodiments of the present disclosure may be a mobile phone (a cell phone), a tablet computer, and the like.

The first body 21 includes a first motherboard 211, and the second body 22 includes a second motherboard 221. A first end of the radio-frequency transmission line 1 is coupled to the first motherboard 211, and a second end of the radio-frequency transmission line 1 is coupled to the second motherboard 221.

As illustrated in FIGS. 2 and 5, the radio-frequency transmission line 1 includes 2N+1 band-shaped line segments 11 and 2N coplanar waveguide segments 12. The 2N+1 band-shaped line segments 11 and the 2N coplanar waveguide segments 12 are alternately arranged in the extending direction of the radio-frequency transmission line 1. The 2N+1 band-shaped line segments 11 and the 2N coplanar waveguide segments 12 are connected sequentially. The extending direction of the radio-frequency transmission line 1 is represented by an arrow A in FIG. 5.

The radio-frequency transmission line 1 includes the 2N+1 band-shaped line segments 11 and the 2N coplanar waveguide segments 12, thus lengths of each band-shaped line segment 11 and each coplanar waveguide segment 12 may be controlled more conveniently and more effectively, to make structures of the radio-frequency transmission line 1 and the electronic device 100 more reasonable.

In some embodiments, each coplanar waveguide segment 12 is located between two adjacent band-shaped line segments 11 in the extending direction of the radio-frequency transmission line 1. Thus, one of the band-shaped line segments 11 may be coupled to the first motherboard 211, and another of the band-shaped line segments 11 may be coupled to the second motherboard 221.

Thus, the radio-frequency transmission line 1 may be coupled to the first motherboard 211 and the second motherboard 221 more conveniently and more easily. For example, one of the band-shaped line segments 11 is coupled to the first motherboard 211 through a first BTB (board-to-board) connector 31, and another of the band-shaped line segments 11 may be coupled to the second motherboard 221 through a second BTB connector 32.

As illustrated in FIG. 2, in one embodiment of the present disclosure, the band-shaped line segments 11 includes a first band-shaped line segment 11a, a second band-shaped line segment 11b and a third band-shaped line segment 11c arranged sequentially in the extending direction of the radio-frequency transmission line 1. The first band-shaped line segment 11a is coupled to the first motherboard 211, and the third band-shaped line segment 11c is coupled to the second motherboard 221. For example, the first band-shaped line segments 11a is coupled to the first motherboard 211 through the first BTB connector 31, and the third band-shaped line segments 11c is coupled to the second motherboard 221 through the second BTB connector 32.

The second band-shaped line segment 11b is coupled to the pivot shaft 4 to retain stationary relative to the pivot shaft 4. The pivot shaft 4 is located between the first band-shaped line segment 11a and the third band-shaped line segment 11c in the extending direction of the radio-frequency transmission line 1. That is to say, the first band-shaped line segment 11a and the third band-shaped line segment 11c are located outside the pivot shaft 4. Thus, when the radio-frequency transmission line 1 is bent (at least one of the first body 21 and the second body 22 is rotated), the first band-shaped line segment 11a and the third band-shaped line segment 11c will not be bent, and also the second band-shaped line segment 11b coupled to the pivot shaft 4 will not be bent, such that the radio-frequency transmission line 1 still has continuous impedance after several bends and can transmit signals with high quality after bending. The coplanar waveguide segments 12 include a first coplanar waveguide segment 12a and a second coplanar waveguide segment 12b. The first coplanar waveguide segment 12a is located between the first band-shaped line segment 11a and the second band-shaped line segment 11b in the extending direction of the radio-frequency transmission line 1, and the first coplanar waveguide segment 12a is coupled to each of the first band-shaped line segment 11a and the second band-shaped line segment 11b. The second coplanar waveguide segment 12b is located between the second band-shaped line segment 11b and the third band-shaped line segment 11c in the extending direction of the radio-frequency transmission line 1, and the second coplanar waveguide segment 12b is coupled to each of the second band-shaped line segment 11b and the third band-shaped line segment 11c.

That is to say, the second band-shaped line segment 11b is located between the first coplanar waveguide segment 12a and the second coplanar waveguide segment 12b in the extending direction of the radio-frequency transmission line 1, and the second band-shaped line segment 11b is coupled to each of the first coplanar waveguide segment 12a and the second coplanar waveguide segment 12b.

The first coplanar waveguide segment 12a and the second coplanar waveguide segment 12b are spaced apart from the metal portion of the pivot shaft 4. Thus, the first coplanar waveguide segment 12a and the second coplanar waveguide segment 12b may be prevented from being covered by the metal portion of the pivot shaft 4, to avoid discontinuous impedance of the first coplanar waveguide segment 12a and the second coplanar waveguide segment 12b, and further avoid the discontinuous impedance of the radio-frequency transmission line 1.

In some embodiments, each of the first coplanar waveguide segment 12a and the second coplanar waveguide segment 12b has a length less than or equal to a first preset value. Thus, the radio-frequency transmission line 1 and the electronic device 100 may have no noise wave below 7.5 GHz, i.e., the radio-frequency transmission line 1 and the electronic device 100 will not have resonance point below 7.5 GHz, to reduce loss of the radio-frequency transmission line 1 and the electronic device 100.

In some embodiments, each of the first coplanar waveguide segment 12a and the second coplanar waveguide segment 12b has a length less than or equal to 12 millimeters. Thus, the radio-frequency transmission line 1 and the electronic device 100 may be further ensured to have no noise wave below 7.5 GHz, i.e., the radio-frequency transmission line 1 and the electronic device 100 are further ensured not to have resonance point below 7.5 GHz, to further reduce loss of the radio-frequency transmission line 1 and the electronic device 100.

In some embodiments, each of the first coplanar waveguide segment 12a and the second coplanar waveguide segment 12b has a length less than or equal to 11 millimeters. Thus, the radio-frequency transmission line 1 and the electronic device 100 may be further ensured to have no noise wave below 7.5 GHz, i.e., the radio-frequency transmission line 1 and the electronic device 100 are further ensured not to have resonance point below 7.5 GHz, to further reduce loss of the radio-frequency transmission line 1 and the electronic device 100.

In some embodiments, each of the first coplanar waveguide segment 12a and the second coplanar waveguide segment 12b has a length less than or equal to 10 millimeters. Thus, the radio-frequency transmission line 1 and the electronic device 100 may be further ensured to have no noise wave below 7.5 GHz, i.e., the radio-frequency transmission line 1 and the electronic device 100 are further ensured not to have resonance point below 7.5 GHz, to further reduce loss of the radio-frequency transmission line 1 and the electronic device 100.

In some embodiments, each of the first coplanar waveguide segment 12a and the second coplanar waveguide segment 12b has a length less than or equal to 8 millimeters. Thus, the radio-frequency transmission line 1 and the electronic device 100 may be further ensured to have no noise wave below 7.5 GHz, i.e., the radio-frequency transmission line 1 and the electronic device 100 are further ensured not to have resonance point below 7.5 GHz, to further reduce loss of the radio-frequency transmission line 1 and the electronic device 100.

For example, the length of each of the first coplanar waveguide segment 12a and the second coplanar waveguide segment 12b may be 5 millimeters, 5.5 millimeters, 6 millimeters, 6.5 millimeters, 7 millimeters, 7.5 millimeters, 8 millimeters, 8.5 millimeters, 9 millimeters, 9.5 millimeters, 10 millimeters, 10.5 millimeters, 11 millimeters, 11.5 millimeters or 12 millimeters.

In some embodiments, lengths of the first coplanar waveguide segment 12a and the second coplanar waveguide segment 12b may be equal to each other. Thus, the radio-frequency transmission line 1 and the electronic device 100 may have more reasonable structures. Lengths of the first band-shaped line segment 11a and the third band-shaped line segment 11c may be equal to each other. Thus, the radio-frequency transmission line 1 and the electronic device 100 may have more reasonable structures.

As illustrated in FIG. 5, in another embodiment of the present disclosure, the band-shaped line segments 11 include a first band-shaped line segment 11a, a second band-shaped line segment 11b, a third band-shaped line segment 11c, a fourth band-shaped line segment 11d and a fifth band-shaped line segment 11e arranged sequentially in the extending direction of the radio-frequency transmission line 1. The first band-shaped line segment 11a is coupled to the first motherboard 211, and the fifth band-shaped line segment 11e is coupled to the second motherboard 221. For example, the first band-shaped line segments 11a is coupled to the first motherboard 211 through the first BTB connector 31, and the fifth band-shaped line segments 11e is coupled to the second motherboard 221 through the second BTB connector 32.

The third band-shaped line segment 11c is coupled to the pivot shaft 4 to retain stationary relative to the pivot shaft 4. The pivot shaft 4 is located between the first band-shaped line segment 11a and the fifth band-shaped line segment 11e in the extending direction of the radio-frequency transmission line 1. That is to say, the first band-shaped line segment 11a and the fifth band-shaped line segment 11e are located outside the pivot shaft 4. Thus, when the radio-frequency transmission line 1 is bent (at least one of the first body 21 and the second body 22 is rotated), the first band-shaped line segment 11a and the fifth band-shaped line segment 11e will not be bent, and also the third band-shaped line segment 11c coupled to the pivot shaft 4 will not be bent, such that the radio-frequency transmission line 1 still has continuous impedance after several bends and can transmit signals with high quality after bending. The coplanar waveguide segments include a first coplanar waveguide segment 12a, a second coplanar waveguide segment 12b, a third coplanar waveguide segment 12c, and a fourth coplanar waveguide segment 12d. The first coplanar waveguide segment 12a is located between the first band-shaped line segment 11a and the second band-shaped line segment 11b in the extending direction of the radio-frequency transmission line 1, and the first coplanar waveguide segment 12a is coupled to each of the first band-shaped line segment 11a and the second band-shaped line segment 11b. The second coplanar waveguide segment 12b is located between the second band-shaped line segment 11b and the third band-shaped line segment 11c in the extending direction of the radio-frequency transmission line 1, and the second coplanar waveguide segment 12b is coupled to each of the second band-shaped line segment 11b and the third band-shaped line segment 11c. The third coplanar waveguide segment 12c is located between the third band-shaped line segment 11c and the fourth band-shaped line segment 11d in the extending direction of the radio-frequency transmission line 1, and the third coplanar waveguide segment 12c is coupled to each of the third band-shaped line segment 11c and the fourth band-shaped line segment 11d. The fourth coplanar waveguide segment 12d is located between the fourth band-shaped line segment 11d and the fifth band-shaped line segment 11e in the extending direction of the radio-frequency transmission line 1, and the fourth coplanar waveguide segment 12d is coupled to each of the fourth band-shaped line segment 11d and the fifth band-shaped line segment 11e.

That is to say, the radio-frequency transmission line 1 includes the first band-shaped line segment 11a, the first coplanar waveguide segment 12a, the second band-shaped line segment 11b, the second coplanar waveguide segment 12b, the third band-shaped line segment 11c, the third coplanar waveguide segment 12c, the fourth band-shaped line segment 11d, the fourth coplanar waveguide segment 12d and the fifth band-shaped line segment 11e arranged sequentially in the extending direction. The first band-shaped line segment 11a, the first coplanar waveguide segment 12a, the second band-shaped line segment 11b, the second coplanar waveguide segment 12b, the third band-shaped line segment 11c, the third coplanar waveguide segment 12c, the fourth band-shaped line segment 11d, the fourth coplanar waveguide segment 12d and the fifth band-shaped line segment 11e are connected sequentially.

The first coplanar waveguide segment 12a, the second coplanar waveguide segment 12b, the third coplanar waveguide segment 12c and the fourth coplanar waveguide segment 12d are spaced apart from the metal portion of the pivot shaft 4. Thus, the first coplanar waveguide segment 12a, the second coplanar waveguide segment 12b, the third coplanar waveguide segment 12c and the fourth coplanar waveguide segment 12d may be prevented from being covered by the metal portion of the pivot shaft 4, to avoid discontinuous impedance of the first coplanar waveguide segment 12a, the second coplanar waveguide segment 12b, the third coplanar waveguide segment 12c and the fourth coplanar waveguide segment 12d, and further avoid the discontinuous impedance of the radio-frequency transmission line 1.

The radio-frequency transmission line 1 includes the first coplanar waveguide segment 12a, the second coplanar waveguide segment 12b, the third coplanar waveguide segment 12c and the fourth coplanar waveguide segment 12d, that is, the radio-frequency transmission line 1 includes four coplanar waveguide segments 12. Thus, the radio-frequency transmission line 1 and the electronic device 100 may have no noise wave below 7.5 GHz, i.e., the radio-frequency transmission line 1 and the electronic device 100 will not have resonance point below 7.5 GHz, to reduce loss of the radio-frequency transmission line 1 and the electronic device 100.

In some embodiments, the pivot shaft 4 has a first edge and a second edge opposite in the extending direction of the radio-frequency transmission line 1. The first coplanar waveguide segment 12a, the second band-shaped line segment 11b, the second coplanar waveguide segment 12b, the third band-shaped line segment 11c, the third coplanar waveguide segment 12c, the fourth band-shaped line segment 11d, the fourth coplanar waveguide segment 12d are located between the first edge and the second edge in the extending direction of the radio-frequency transmission line 1.

Since the radio-frequency transmission line 1 includes many band-shaped line segments 11 and coplanar waveguide segments 12, the second band-shaped line segment 11b and the fourth band-shaped line segment 11d may have relatively small lengths. Thus, when the radio-frequency transmission line 1 is bent (at least one of the first body 21 and the second body 22 is rotated), the second band-shaped line segment 11b and the fourth band-shaped line segment 11d will only be slightly bent, which will not cause breaking of metal ground layers of the second band-shaped line segment 11b and the fourth band-shaped line segment 11d after several bends, avoiding discontinuous impedance of the band-shaped line segment 11.

Figure 10:
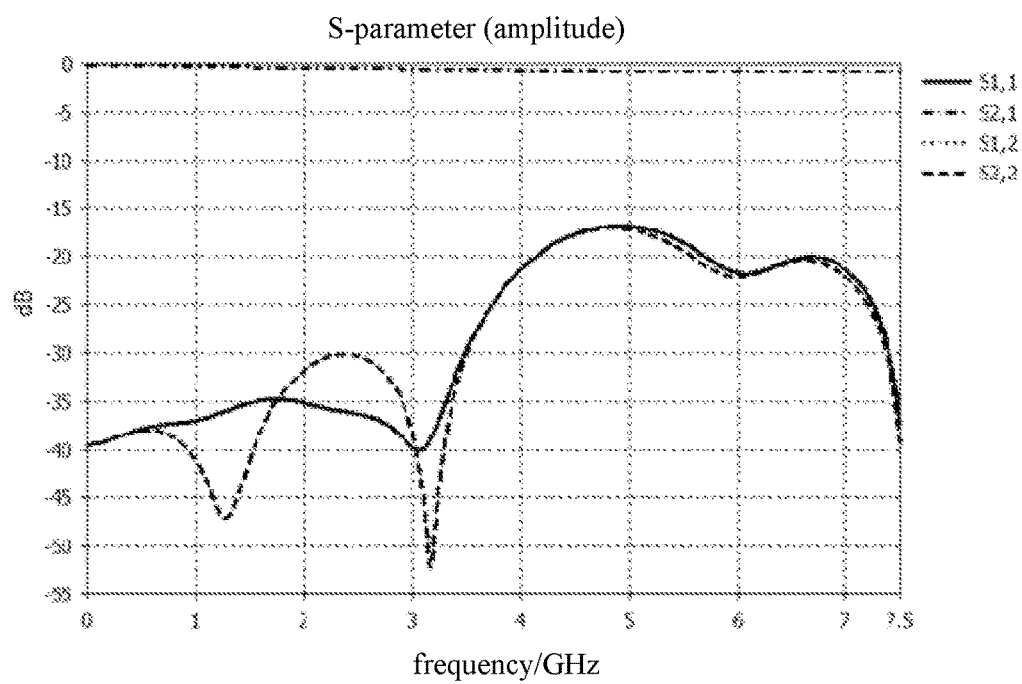
FIG. 10 is an S-parameter simulation result diagram of a radio-frequency transmission line according to an embodiment of the present disclosure.

FIG. 10 is an S-parameter (amplitude) simulation result diagram of a radio transmission line 1 according to an embodiment of the present disclosure, with the horizontal axis representing frequency (GHz) and the vertical axis representing amplitude (dB), and illustrating S1,1 (solid line), S2,1 (dash-dot line), S1,2 (dot line) and S2,2 (dashed line).

Figure 11:
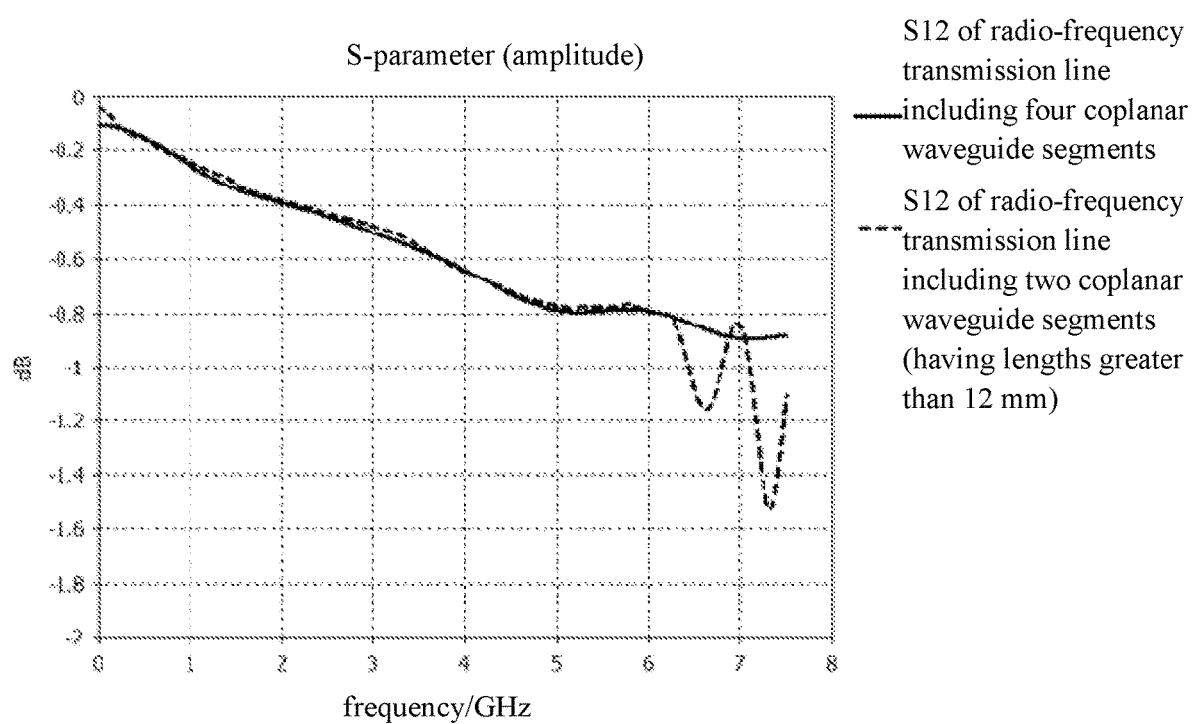
FIG. 11 is an S12-parameter simulation result diagram of a radio-frequency transmission line according to an embodiment of the present disclosure.

FIG. 11 is an S-parameter (amplitude) simulation result diagram of a radio transmission line 1 according to an embodiment of the present disclosure, with the horizontal axis representing frequency (GHz) and the vertical axis representing amplitude (dB), and illustrating S12 of a radio transmission line 1 including four coplanar waveguide segments (solid line) and S12 of a radio transmission line 1 including two coplanar waveguide segments (having lengths greater than 12 mm, dashed line). As illustrated in FIG. 11, the radio-frequency transmission line 1 including the first coplanar waveguide segment 12a and the second coplanar waveguide segment 12b (each of the first coplanar waveguide segment 12a and the second coplanar waveguide segment 12b has a length greater than 12 millimeters) generates two noise waves in a range of 6 GHz-7.5 GHz, resulting in relatively large loss. The radio-frequency transmission line 1 including the first coplanar waveguide segment 12a, the second coplanar waveguide segment 12b, the third coplanar waveguide segment 12c, and the fourth coplanar waveguide segment 12d will not generate noise wave below 7.5 GHz, to reduce the loss.

In some embodiments, each of the first coplanar waveguide segment 12a, the second coplanar waveguide segment 12b, the third coplanar waveguide segment 12c and the fourth coplanar waveguide segment 12d has a length greater than or equal to a second preset value and less than or equal to a third preset value. Thus, the radio-frequency transmission line 1 and the electronic device 100 may be further ensured to have no noise wave below 7.5 GHz, i.e., the radio-frequency transmission line 1 and the electronic device 100 are further ensured not to have resonance point below 7.5 GHz, to further reduce loss of the radio-frequency transmission line 1 and the electronic device 100.

In some embodiments, each of the first coplanar waveguide segment 12a, the second coplanar waveguide segment 12b, the third coplanar waveguide segment 12c and the fourth coplanar waveguide segment 12d has a length greater than or equal to 12 millimeters and less than or equal to 17 millimeters. Thus, the radio-frequency transmission line 1 and the electronic device 100 may be further ensured to have no noise wave below 7.5 GHz, i.e., the radio-frequency transmission line 1 and the electronic device 100 are further ensured not to have resonance point below 7.5 GHz, to further reduce loss of the radio-frequency transmission line 1 and the electronic device 100.

In some embodiments, each of the first coplanar waveguide segment 12a, the second coplanar waveguide segment 12b, the third coplanar waveguide segment 12c and the fourth coplanar waveguide segment 12d has a length greater than or equal to 13 millimeters and less than or equal to 16 millimeters. Thus, the radio-frequency transmission line 1 and the electronic device 100 may be further ensured to have no noise wave below 7.5 GHz, i.e., the radio-frequency transmission line 1 and the electronic device 100 are further ensured not to have resonance point below 7.5 GHz, to further reduce loss of the radio-frequency transmission line 1 and the electronic device 100.

In some embodiments, each of the first coplanar waveguide segment 12a, the second coplanar waveguide segment 12b, the third coplanar waveguide segment 12c and the fourth coplanar waveguide segment 12d has a length greater than or equal to 13.5 millimeters and less than or equal to 15.5 millimeters. Thus, the radio-frequency transmission line 1 and the electronic device 100 may be further ensured to have no noise wave below 7.5 GHz, i.e., the radio-frequency transmission line 1 and the electronic device 100 are further ensured not to have resonance point below 7.5 GHz, to further reduce loss of the radio-frequency transmission line 1 and the electronic device 100.

In some embodiments, each of the first coplanar waveguide segment 12a, the second coplanar waveguide segment 12b, the third coplanar waveguide segment 12c and the fourth coplanar waveguide segment 12d has a length greater than or equal to 14 millimeters and less than or equal to 15 millimeters. Thus, the radio-frequency transmission line 1 and the electronic device 100 may be further ensured to have no noise wave below 7.5 GHz, i.e., they are further ensured not to have resonance point below 7.5 GHz, to further reduce loss of the radio-frequency transmission line 1 and the electronic device 100.

In some embodiments, each of the first coplanar waveguide segment 12a, the second coplanar waveguide segment 12b, the third coplanar waveguide segment 12c and the fourth coplanar waveguide segment 12d has a length greater than or equal to 14.1 millimeters and less than or equal to 14.4 millimeters. Thus, the radio-frequency transmission line 1 and the electronic device 100 may be further ensured to have no noise wave below 7.5 GHz, i.e., the radio-frequency transmission line 1 and the electronic device 100 are further ensured not to have resonance point below 7.5 GHz, to further reduce loss of the radio-frequency transmission line 1 and the electronic device 100.

For example, the length of each of the first coplanar waveguide segment 12a, the second coplanar waveguide segment 12b, the third coplanar waveguide segment 12c and the fourth coplanar waveguide segment 12d may be 12 millimeters, 12.5 millimeters, 13 millimeters, 13.5 millimeters, 14 millimeters, 14.1 millimeters, 14.2 millimeters, 14.3 millimeters, 14.4 millimeters, 14.5 millimeters, 14.6 millimeters, 14.7 millimeters, 14.8 millimeters, 14.9 millimeters, 15 millimeters, 15.5 millimeters, 16 millimeters, 16.5 millimeters or 17 millimeters.

In some embodiments, lengths of each of the first coplanar waveguide segment 12a, the second coplanar waveguide segment 12b, the third coplanar waveguide segment 12c and the fourth coplanar waveguide segment 12d may be equal to each other. Thus, the radio-frequency transmission line 1 and the electronic device 100 may have more reasonable structures.

Lengths of the first band-shaped line segment 11a and the fifth band-shaped line segment lie may be equal to each other. Thus, the radio-frequency transmission line 1 and the electronic device 100 may have more reasonable structures. Lengths of the second band-shaped line segment 11b and the fourth band-shaped line segment 11d may be equal to each other.

Thus, the radio-frequency transmission line 1 and the electronic device 100 may have more reasonable structures.

In some embodiments, each of the second band-shaped line segment 11b and the fourth band-shaped line segment 11d has a length less than or equal to a fourth preset value. Thus, when the radio-frequency transmission line 1 is bent (at least one of the first body 21 and the second body 22 is rotated), the second band-shaped line segment 11b and the fourth band-shaped line segment 11d will only be slightly bent.

Each of the second band-shaped line segment 11b and the fourth band-shaped line segment 11d has a length less than or equal to the fourth preset value, the degree of bending of the second band-shaped line segment 11b and the fourth band-shaped line segment 11d is greatly reduced, to prevent the metal ground layers of the second band-shaped line segment 11b and the fourth band-shaped line segment 11d from breaking, further ensuring that the radio-frequency transmission line 1 still has continuous impedance after several bends and can transmit signals with high quality after bending.

In some embodiments, each of the second band-shaped line segment 11b and the fourth band-shaped line segment 11d has a length less than or equal to 6 millimeters. Thus, it may be further ensured that the radio-frequency transmission line 1 still has continuous impedance after several bends and can transmit signals with high quality after bending.

In some embodiments, each of the second band-shaped line segment 11b and the fourth band-shaped line segment 11d has a length less than or equal to 5 millimeters. Thus, it may be further ensured that the radio-frequency transmission line 1 still has continuous impedance after several bends and can transmit signals with high quality after bending.

In some embodiments, each of the second band-shaped line segment 11b and the fourth band-shaped line segment 11d has a length less than or equal to 4.5 millimeters. Thus, it may be further ensured that the radio-frequency transmission line 1 still has continuous impedance after several bends and can transmit signals with high quality after bending.

Figure 4:
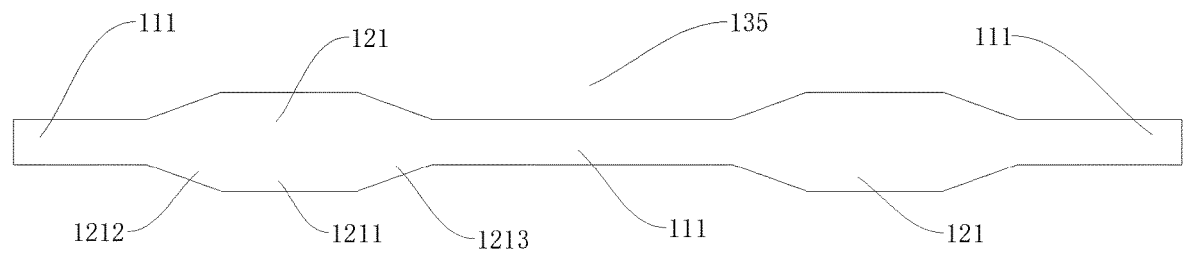
FIG. 4 is a schematic view of a metal trace layer of a radio-frequency transmission line according to an embodiment of the present disclosure.
Figure 7:
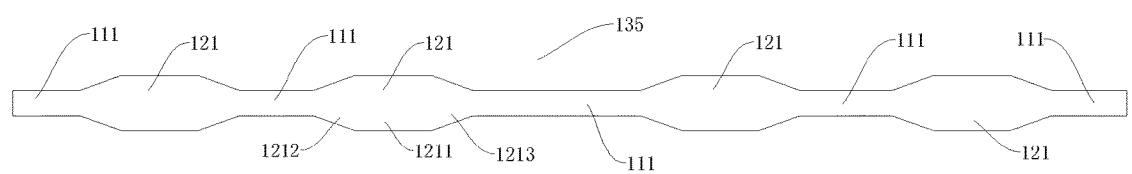
FIG. 7 is a schematic view of a metal trace layer of a radio-frequency transmission line according to another embodiment of the present disclosure.

As illustrated in FIGS. 4 and 7 which show a metal trace layer 135, the metal trace layer 121 of each coplanar waveguide segment 12 includes a base part 1211, a first transition part 1212 and a second transition part 1213. A width of each base part 1211 is greater than a width of the metal trace layer 111 of the band-shaped line segment 11. The base part 1211 is located between the first transition part 1212 and the second transition part 1213 in the extending direction of the radio-frequency transmission line 1.

A first end part of the first transition part 1212 is coupled to the metal trace layer 111 of a corresponding band-shaped line segment 11, and a first end part of the second transition part 1213 is coupled to the metal trace layer 111 of a corresponding band-shaped line segment 11. That is to say, the first transition part 1212 and the second transition part 1213 of the coplanar waveguide segment 12 are coupled to the metal trace layers 111 of the band-shaped line segments 11 adjacent to this coplanar waveguide segment 12. For example, the first end part of the first transition part 1212 of the first coplanar waveguide segment 12a is coupled to the metal trace layer 111 of the first band-shaped line segment 11a, and the first end part of the second transition part 1213 of the first coplanar waveguide segment 12a is coupled to the metal trace layer 111 of the second band-shaped line segment 11b.

A second end part of the first transition part 1212 is coupled to the base part 1211, and a second end part of the second transition part 1213 is coupled to the base part 1211. A width of the first end part of the first transition part 1212 is equal to a width of the metal trace layer 111 of a corresponding band-shaped line segment 11, and a width of the second end part of the first transition part 1212 is equal to a width of the base part 1211. A width of the first end part of the second transition part 1213 is equal to a width of the metal trace layer 111 of a corresponding band-shaped line segment 11, and a width of the second end part of the second transition part 1213 is equal to the width of the base part 1211.

That is to say, the width of the first end part of the first transition part 1212 is equal to the width of the metal trace layer 111 of the band-shaped line segment 11 coupled to it, and the width of the first end part of the second transition part 1213 is equal to the width of the metal trace layer 111 of the band-shaped line segment 11 coupled to it.

The width of the first transition part 1212 increases in the extending direction of the radio-frequency transmission line 1 and along a direction towards the base part 1211, and the width of the second transition part 1213 decreases in the extending direction of the radio-frequency transmission line 1 and along a direction away from the base part 1211. Thus, the radio-frequency transmission line 1 and the electronic device 100 may have more reasonable structures and more continuous impedance.

For example, the extending direction of the radio-frequency transmission line 1 is consistent with a left-right direction, the first transition part 1212 is located at a left side of the base part 1211, and the second transition part 1213 is located at a right side of the base part 1211. The width of the first transition part 1212 increases from left to right, and the width of the second transition part 1213 decreases from left to right. The left-right direction is represented by an arrow B in FIG. 5.

In a width direction of the radio-frequency transmission line 1 (a width direction of the metal trace layer 111), two sides of the metal trace layer 111 of the band-shaped line segment 11 may be metal ground; and in the width direction of the radio-frequency transmission line 1 (a width direction of the metal trace layer 121), two sides of the metal trace layer 121 of the coplanar waveguide segment 12 may be metal ground.

In some embodiments, the width of the metal trace layer 111 of the band-shaped line segment 11 is greater than or equal to 0.08 millimeters and less than or equal to 0.2 millimeters. In some embodiments, the width of the metal trace layer 111 of the band-shaped line segment 11 is greater than or equal to 0.085 millimeters and less than or equal to 0.15 millimeters. In some embodiments, the width of the metal trace layer 111 of the band-shaped line segment 11 is greater than or equal to 0.9 millimeters and less than or equal to 0.1 millimeters. Thus, the radio-frequency transmission line 1 and the electronic device 100 may have more reasonable structures and more continuous impedance.

In some embodiments, the width of the base part 1211 is greater than or equal to 0.3 millimeters and less than or equal to 0.5 millimeters. In some embodiments, the width of the base part 1211 is greater than or equal to 0.33 millimeters and less than or equal to 0.47 millimeters. In some embodiments, the width of the base part 1211 is greater than or equal to 0.35 millimeters and less than or equal to 0.45 millimeters. In some embodiments, the width of the base part 1211 is 0.4 millimeters. Thus, the radio-frequency transmission line 1 and the electronic device 100 may have more reasonable structures and more continuous impedance.

As illustrated in FIG. 7, the width of the first transition part 1212 gradually increases in the extending direction of the radio-frequency transmission line 1 and along a direction towards the base part 1211, and the width of the second transition part 1213 gradually decreases in the extending direction of the radio-frequency transmission line 1 and along a direction away from the base part 1211. Thus, the radio-frequency transmission line 1 and the electronic device 100 may have more reasonable structures and more continuous impedance.

In some embodiments, projection of each of the first transition part 1212 and the second transition part 1213 on a first plane is an isosceles trapezoid, and the first plane is perpendicular to a thickness direction of the radio-frequency transmission line 1. Thus, the radio-frequency transmission line 1 and the electronic device 100 may have more reasonable structures and more continuous impedance.

An interior angle of a base of the isosceles trapezoid adjacent to the corresponding band-shaped line segment 11 is greater than or equal to 100 degrees and less than or equal to 120 degrees. In other words, an angle between the base of the isosceles trapezoid adjacent to the corresponding band-shaped line segment 11 and a leg of the isosceles trapezoid is greater than or equal to 100 degrees and less than or equal to 120 degrees. Thus, the radio-frequency transmission line 1 and the electronic device 100 may have more reasonable structures and more continuous impedance.

For example, an interior angle of the base of the first transition part 1212 of the first coplanar waveguide segment 12a adjacent to the first band-shaped line segment 11a is greater than or equal to 100 degrees and less than or equal to 120 degrees, and an interior angle of the base of the second transition part 1213 of the first coplanar waveguide segment 12a adjacent to the second band-shaped line segment 11b is greater than or equal to 100 degrees and less than or equal to 120 degrees.

In some embodiments, the interior angle of the base of the isosceles trapezoid adjacent to the corresponding band-shaped line segment 11 is greater than or equal to 103 degrees and less than or equal to 115 degrees. Thus, the radio-frequency transmission line 1 and the electronic device 100 may have more reasonable structures and more continuous impedance.

Figure 8:
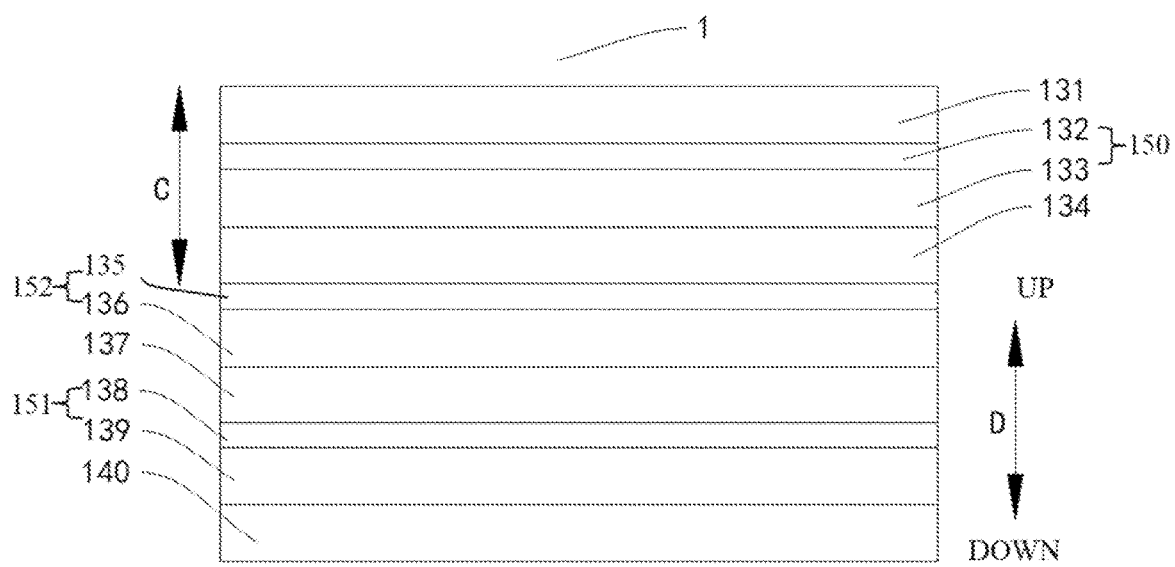
FIG. 8 is a sectional view taken along E-E in FIG. 5.

As illustrated in FIG. 8, the radio-frequency transmission line 1 includes a first metal ground assembly 150, a second metal ground assembly 151 and a metal trace assembly 152. The first metal ground assembly 150 includes a first modified polyimide layer 133 and a first metal ground layer 132 arranged on the first modified polyimide layer 133, the second metal ground assembly 151 includes a second modified polyimide layer 139 and a second metal ground layer 138 arranged on the second modified polyimide layer 139, and the metal trace assembly 152 includes a third modified polyimide layer 136 and a metal trace layer 135 arranged on the third modified polyimide layer 136. That is to say, the metal trace layer 135 includes the metal trace layer 111 of the band-shaped line segment 11 and the metal trace layer 121 of the coplanar waveguide segment 12.

The first metal ground layer 132, the first modified polyimide layer 133, the metal trace layer 135, the third modified polyimide layer 136, the second metal ground layer 138 and the second modified polyimide layer 139 are arranged sequentially in the thickness direction of the radio-frequency transmission line 1. For example, the thickness direction of the radio-frequency transmission line 1 is consistent with an up-and-down direction, the first metal ground layer 132, the first modified polyimide layer 133, the metal trace layer 135, the third modified polyimide layer 136, the second metal ground layer 138 and the second modified polyimide layer 139 are arranged sequentially from top to bottom. The thickness direction of the radio-frequency transmission line 1 is represented by an arrow C in FIG. 8; and the up-and-down direction is represented by an arrow D in FIG. 8.

Figure 3:
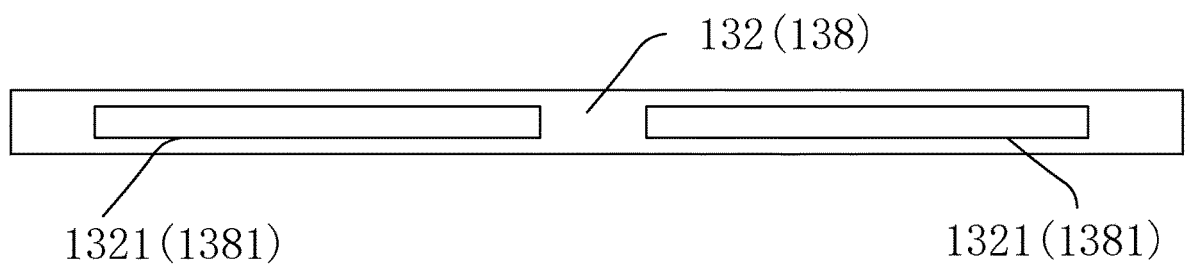
FIG. 3 is a schematic view of a first metal ground layer (a second metal ground layer) of a radio-frequency transmission line according to an embodiment of the present disclosure.
Figure 6:
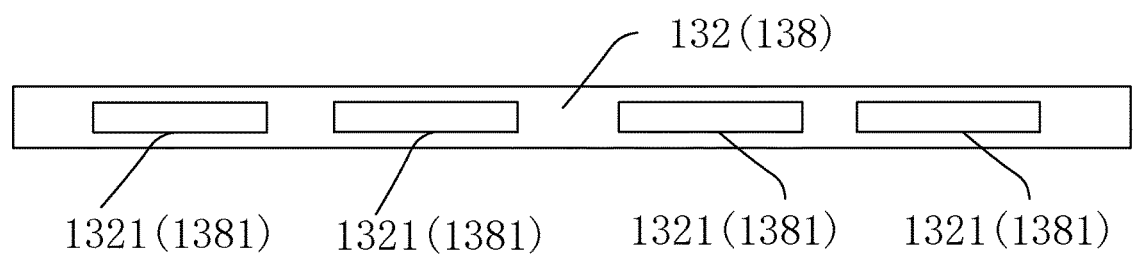
FIG. 6 is a schematic view of a first metal ground layer (a second metal ground layer) of a radio-frequency transmission line according to another embodiment of the present disclosure.

As illustrated in FIGS. 3 and 6, the first metal ground layer 132 has a first through hole 1321 therethrough in the thickness direction of the radio-frequency transmission line 1, and the second metal ground layer 138 has a second through hole 1381 therethrough in the thickness direction of the radio-frequency transmission line 1. The first through hole 1321 and the second through hole 1381 are opposite in the thickness direction of the radio-frequency transmission line 1. A portion of the radio-frequency transmission line 1 opposite the first through hole 1321 (the second through hole 1381) in the thickness direction constitutes the coplanar waveguide segment 12, and the band-shaped line segment 11 of the radio-frequency transmission line 11 and the first through hole 1321 (the second through hole 1381) are staggered in the thickness direction of the radio-frequency transmission line 1.

That that is to say, the first metal ground layer 132 of the band-shaped line segment 11 does not have the first through hole 1321, the second metal ground layer 138 of the band-shaped line segment 11 does not have the second through hole 1381; the coplanar waveguide segment 12 is opposite the first through hole 1321 and the second through hole 1381 in the thickness direction of the radio-frequency transmission line 1 such that the coplanar waveguide segment 12 does not have the first metal ground layer 132 and the second metal ground layer 138. For example, each of the first coplanar waveguide segment 12a, the second coplanar waveguide segment 12b, the third coplanar waveguide segment 12c and the fourth coplanar waveguide segment 12d is opposite one first through hole 1321 and one second through hole 1381 in the thickness direction of the radio-frequency transmission line 1.

Figure 9:
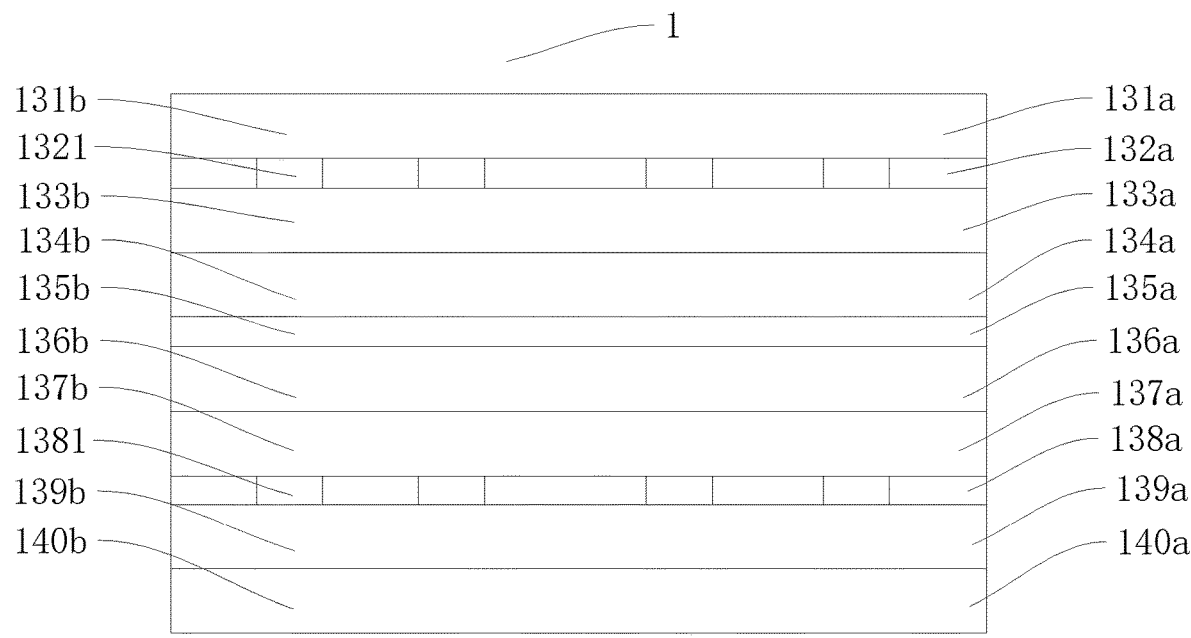
FIG. 9 is a sectional view taken along F-F in FIG. 5.

In other words, as illustrated in FIG. 9, each band-shaped line segment 11 includes the first modified polyimide layer 133a, the first metal ground layer 132a arranged on the first modified polyimide layer 133a, the second modified polyimide layer 139a, the second metal ground layer 138a arranged on the second modified polyimide layer 139a, the third modified polyimide layer 136a, and the metal trace layer 135a arranged on the third modified polyimide layer 136a. The first metal ground layer 132a, the first modified polyimide layer 133a, the metal trace layer 135a, the third modified polyimide layer 136a, the second metal ground layer 138a and the second modified polyimide layer 139a are arranged sequentially in the thickness direction of the radio-frequency transmission line 1.

Each coplanar waveguide segment 12 includes the first modified polyimide layer 133b, a second modified polyimide layer 139b, a metal trace layer 135b arranged on the third modified polyimide layer 136b, and the third modified polyimide layer 136b. The first modified polyimide layer 133b, the metal trace layer 135b, the third modified polyimide layer 136b, and the second modified polyimide layer 139b are arranged sequentially in the thickness direction of the radio-frequency transmission line 1. For example, the first modified polyimide layer 133 includes the first modified polyimide layer 133a and the first modified polyimide layer 133b.

The first metal ground layer 132, the second metal ground layer 138 and the metal trace layer 135 are arranged on modified polyimide layers, bendability of the radio-frequency transmission line 1 may be greatly improved, and bending times of the radio-frequency transmission line 1 can reach more than 200,000 times.

As illustrated in FIG. 8, the radio-frequency transmission line 1 further includes a first adhesive layer 134 and a second adhesive layer 137. The first adhesive layer 134 is arranged between the first metal ground assembly 150 and the metal trace assembly 152, and the second adhesive layer 137 is arranged between the second metal ground assembly 151 and the metal trace assembly 152.

That is to say, the first adhesive layer 134 is located between the first modified polyimide layer 133 and the metal trace layer 135 in the thickness direction of the radio-frequency transmission line 1, and the second adhesive layer 137 is located between the third modified polyimide layer 136 and the second metal ground layer 138 in the thickness direction of the radio-frequency transmission line 1. Arrangement of the first adhesive layer 134 and the second adhesive layer 137 may make the structure of the radio-frequency transmission line 1 firmer.

As illustrated in FIG. 8, the radio-frequency transmission line 1 further includes a first cover film layer 131 and a second cover film layer 140. The first cover film layer 131 is arranged on the first metal ground assembly 150, and the second cover film layer 140 is arranged on the second metal ground assembly 151. The first metal ground assembly 150 is located between the first cover film layer 131 and the metal trace assembly 152 in the thickness direction of the radio-frequency transmission line 1, and the second metal ground assembly 151 is located between the second cover film layer 140 and the metal trace assembly 152 in the thickness direction of the radio-frequency transmission line 1.

In other words, the first metal ground layer 132 is located between the first cover film layer 131 and the first modified polyimide layer 133 in the thickness direction of the radio-frequency transmission line 1, and the second modified polyimide layer 139 is located between the second cover film layer 140 and the second metal ground layer 138 in the thickness direction of the radio-frequency transmission line 1. Arrangement of the first cover film layer 131 and the second cover film layer 140 may make the structure of the radio-frequency transmission line 1 more reasonable.

As illustrated in FIG. 9, each band-shaped line segment 11 includes the first cover film layer 131a, the first metal ground layer 132a, the first modified polyimide layer 133a, the first adhesive layer 134a, the metal trace layer 135a, the third modified polyimide layer 136a, the second adhesive layer 137a, the second metal ground layer 138a, the second modified polyimide layer 139a and the second cover film layer 140a are arranged sequentially in the thickness direction of the radio-frequency transmission line 1 (e.g., from top to bottom).

Each coplanar waveguide segment 12 includes the first cover film layer 131b, the first modified polyimide layer 133b, the first adhesive layer 134b, the metal trace layer 135b, the third modified polyimide layer 136b, the second adhesive layer 137b, the second modified polyimide layer 139b and the second cover film layer 140b are arranged sequentially in the thickness direction of the radio-frequency transmission line 1 (e.g., from top to bottom). The first through hole 1321 is formed between the first cover film layer 131b and the first modified polyimide layer 133b, and the second through hole 1381 is formed between the second cover film layer 137b and the second modified polyimide layer 139b.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counterclockwise," "axial," "radial" and "circumferential" should be construed to refer to the orientation as then described or as shown in the drawings under discussion. These relative terms are for convenience of description and do not require that the present disclosure be constructed or operated in a particular orientation.

In addition, terms such as "first" and "second" are used herein for purposes of description and are not intended to indicate or imply relative importance or significance. Thus, the feature defined with "first" and "second" may comprise one or more of this feature. In the description of the present disclosure, "a plurality of" means two or more than two, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements. The above terms can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature. While a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout the present disclosure to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. In addition, without conflicting, various embodiments or examples or features of various embodiments or examples described in the present specification may be combined by those skilled in the art.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

The present disclosure seeks to solve at least one of the problems existing in the related art to at least some extent. To this end, embodiments of the present disclosure propose an electronic device and its radio-frequency transmission line.

The electronic device according to embodiments of the present disclosure includes a first body and a second body rotatably connected relative to each other through a pivot shaft, the first body including a first motherboard, the second body including a second motherboard; and a radio-frequency transmission line having a first end coupled to the first motherboard and a second end coupled to the second motherboard, the radio-frequency transmission line including at least one band-shaped line segment and at least two coplanar waveguide segments, the band-shaped line segment being coupled to the coplanar waveguide segments, in which one band-shaped line segment is located between two coplanar waveguide segments in an extending direction of the radio-frequency transmission line, one band-shaped line segment is coupled to the pivot shaft to retain stationary relative to the pivot shaft, and the coplanar waveguide segments are spaced apart from a metal portion of the pivot shaft.

The electronic device according to embodiments of the present disclosure has advantages of continuous impedance after several bends of the radio-frequency transmission line and high signal transmission quality after bending of the radio-frequency transmission line.

In some embodiments, the radio-frequency transmission line includes 2N+1 band-shaped line segments and 2N coplanar waveguide segments arranged alternately and connected sequentially in the extending direction, in which N is an integer greater than or equal to 1, each coplanar waveguide segment is located between two adjacent band-shaped line segments in the extending direction, one of the band-shaped line segments is coupled to the first motherboard, and another of the band-shaped line segments is coupled to the second motherboard.

In some embodiments, the band-shaped line segments include a first band-shaped line segment, a second band-shaped line segment and a third band-shaped line segment arranged sequentially in the extending direction, the first band-shaped line segment is coupled to the first motherboard, the third band-shaped line segment is coupled to the second motherboard, and the second band-shaped line segment is coupled to the pivot shaft to retain stationary relative to the pivot shaft, in which the pivot shaft is located between the first band-shaped line segment and the third band-shaped line segment in the extending direction;

the coplanar waveguide segments include a first coplanar waveguide segment located between the first band-shaped line segment and the second band-shaped line segment in the extending direction, the first coplanar waveguide segment being coupled to each of the first band-shaped line segment and the second band-shaped line segment; and a second coplanar waveguide segment located between the second band-shaped line segment and the third band-shaped line segment in the extending direction, the second coplanar waveguide segment being coupled to each of the second band-shaped line segment and the third band-shaped line segment, the first coplanar waveguide segment and the second coplanar waveguide segment are spaced apart from the metal portion of the pivot shaft.

In some embodiments, each of the first coplanar waveguide segment and the second coplanar waveguide segment has a length less than or equal to a first preset value.

In some embodiments, the band-shaped line segments include a first band-shaped line segment, a second band-shaped line segment, a third band-shaped line segment, a fourth band-shaped line segment and a fifth band-shaped line segment arranged sequentially in the extending direction, the first band-shaped line segment is coupled to the first motherboard, the fifth band-shaped line segment is coupled to the second motherboard, and the third band-shaped line segment is coupled to the pivot shaft to retain stationary relative to the pivot shaft, in which the pivot shaft is located between the first band-shaped line segment and the fifth band-shaped line segment in the extending direction;

the coplanar waveguide segments include a first coplanar waveguide segment located between the first band-shaped line segment and the second band-shaped line segment in the extending direction, the first coplanar waveguide segment being coupled to each of the first band-shaped line segment and the second band-shaped line segment; a second coplanar waveguide segment located between the second band-shaped line segment and the third band-shaped line segment in the extending direction, the second coplanar waveguide segment being coupled to each of the second band-shaped line segment and the third band-shaped line segment; a third coplanar waveguide segment located between the third band-shaped line segment and the fourth band-shaped line segment in the extending direction, the third coplanar waveguide segment being coupled to each of the third band-shaped line segment and the fourth band-shaped line segment; and a fourth coplanar waveguide segment located between the fourth band-shaped line segment and the fifth band-shaped line segment in the extending direction, the fourth coplanar waveguide segment being coupled to each of the fourth band-shaped line segment and the fifth band-shaped line segment, in which the first coplanar waveguide segment, the second coplanar waveguide segment, the third coplanar waveguide segment and the fourth coplanar waveguide segment are spaced apart from a metal portion of the pivot shaft.

In some embodiments, each of the first coplanar waveguide segment, the second coplanar waveguide segment, the third coplanar waveguide segment and the fourth coplanar waveguide segment has a length greater than or equal to a second preset value and less than or equal to a third preset value.

In some embodiments, each of the second band-shaped line segment and the fourth band-shaped line segment has a length less than or equal to a fourth preset value.

In some embodiments, each coplanar waveguide segment has a metal trace layer including a base part, each base part having a width greater than a width of the metal trace layer of the band-shaped line segment; a first transition part having a first end part coupled to the metal trace layer of a corresponding band-shaped line segment and a second end part coupled to the base part, in which the first end part of the first transition part has a width equal to the width of the metal trace layer of the corresponding band-shaped line segment, the second end part of the first transition part has a width equal to the width of the base part, the first transition part has a width increasing in the extending direction and along a direction towards the base part; and a second transition part having a first end part coupled to the metal trace layer of a corresponding band-shaped line segment and a second end part coupled to the base part, the base part being located between the first transition part and the second transition part in the extending direction, in which the first end part of the second transition part has a width equal to the width of the metal trace layer of the corresponding band-shaped line segment, the second end part of the second transition part has a width equal to the width of the base part, the second transition part has a width decreasing in the extending direction and along a direction away from the base part.

In some embodiments, the width of the first transition part increases gradually in the extending direction and along the direction towards the base part; and the width of the second transition part decreases gradually in the extending direction and along the direction away from the base part.

In some embodiments, the radio-frequency transmission line includes a first metal ground assembly including a first modified polyimide layer and a first metal ground layer arranged on the first modified polyimide layer; a second metal ground assembly including a second modified polyimide layer and a second metal ground layer arranged on the second modified polyimide layer; and a metal trace assembly including a third modified polyimide layer and a metal trace layer arranged on the third modified polyimide layer, the first metal ground layer, the first modified polyimide layer, the metal trace layer, the third modified polyimide layer, the second metal ground layer and the second modified polyimide layer being arranged sequentially in a thickness direction of the radio-frequency transmission line, in which the first metal ground layer has a first through hole therethrough in the thickness direction, the second metal ground layer has a second through hole therethrough in the thickness direction, the first through hole and the second through hole are opposite in the thickness direction, a portion of the radio-frequency transmission line opposite the first through hole in the thickness direction constitutes the coplanar waveguide segment, and the band-shaped line segment of the radio-frequency transmission line is staggered with the first through hole in the thickness direction.

The radio-frequency transmission line according to embodiments of the present disclosure includes: at least one band-shaped line segment and at least two coplanar waveguide segments, one band-shaped line segment is located between two coplanar waveguide segments in an extending direction of the radio-frequency transmission line, the band-shaped line segment being coupled to the coplanar waveguide segments.

The radio-frequency transmission line according to embodiments of the present disclosure has advantages of continuous impedance after several bends and high signal transmission quality after bending.

In some embodiments, the radio-frequency transmission line includes 2N+1 band-shaped line segments and 2N coplanar waveguide segments arranged alternately and connected sequentially in the extending direction, in which N is an integer greater than or equal to 1, each coplanar waveguide segment is located between two adjacent band-shaped line segments in the extending direction.

In some embodiments, the band-shaped line segments include a first band-shaped line segment, a second band-shaped line segment and a third band-shaped line segment arranged sequentially in the extending direction; the coplanar waveguide segments include a first coplanar waveguide segment located between the first band-shaped line segment and the second band-shaped line segment in the extending direction, the first coplanar waveguide segment being coupled to each of the first band-shaped line segment and the second band-shaped line segment; and a second coplanar waveguide segment located between the second band-shaped line segment and the third band-shaped line segment in the extending direction, the second coplanar waveguide segment being coupled to each of the second band-shaped line segment and the third band-shaped line segment.

In some embodiments, each of the first coplanar waveguide segment and the second coplanar waveguide segment has a length less than or equal to a first preset value.

In some embodiments, the band-shaped line segments include a first band-shaped line segment, a second band-shaped line segment, a third band-shaped line segment, a fourth band-shaped line segment and a fifth band-shaped line segment arranged sequentially in the extending direction; the coplanar waveguide segments include a first coplanar waveguide segment located between the first band-shaped line segment and the second band-shaped line segment in the extending direction, the first coplanar waveguide segment being coupled to each of the first band-shaped line segment and the second band-shaped line segment; a second coplanar waveguide segment located between the second band-shaped line segment and the third band-shaped line segment in the extending direction, the second coplanar waveguide segment being coupled to each of the second band-shaped line segment and the third band-shaped line segment; a third coplanar waveguide segment located between the third band-shaped line segment and the fourth band-shaped line segment in the extending direction, the third coplanar waveguide segment being coupled to each of the third band-shaped line segment and the fourth band-shaped line segment; and a fourth coplanar waveguide segment located between the fourth band-shaped line segment and the fifth band-shaped line segment in the extending direction, the fourth coplanar waveguide segment being coupled to each of the fourth band-shaped line segment and the fifth band-shaped line segment.

In some embodiments, each of the first coplanar waveguide segment, the second coplanar waveguide segment, the third coplanar waveguide segment and the fourth coplanar waveguide segment has a length greater than or equal to a second preset value and less than or equal to a third preset value.

In some embodiments, each of the second band-shaped line segment and the fourth band-shaped line segment has a length less than or equal to a fourth preset value.

In some embodiments, each coplanar waveguide segment has a metal trace layer including: a base part, each base part having a width greater than a width of the metal trace layer of the band-shaped line segment; a first transition part having a first end part coupled to the metal trace layer of a corresponding band-shaped line segment and a second end part coupled to the base part, in which the first end part of the first transition part has a width equal to the width of the metal trace layer of the corresponding band-shaped line segment, the second end part of the first transition part has a width equal to the width of the base part, the first transition part has a width increasing in the extending direction and along a direction towards the base part; and a second transition part having a first end part coupled to the metal trace layer of a corresponding band-shaped line segment and a second end part coupled to the base part, the base part being located between the first transition part and the second transition part in the extending direction, in which the first end part of the second transition part has a width equal to the width of the metal trace layer of the corresponding band-shaped line segment, the second end part of the second transition part has a width equal to the width of the base part, the second transition part has a width decreasing in the extending direction and along a direction away from the base part.

In some embodiments, the width of the first transition part increases gradually in the extending direction and along the direction towards the base part; and the width of the second transition part decreases gradually in the extending direction and along the direction away from the base part.

In some embodiments, the radio-frequency transmission line includes a first metal ground assembly including a first modified polyimide layer and a first metal ground layer arranged on the first modified polyimide layer; a second metal ground assembly including a second modified polyimide layer and a second metal ground layer arranged on the second modified polyimide layer; and a metal trace assembly including a third modified polyimide layer and a metal trace layer arranged on the third modified polyimide layer, the first metal ground layer, the first modified polyimide layer, the metal trace layer, the third modified polyimide layer, the second metal ground layer and the second modified polyimide layer being arranged sequentially in a thickness direction of the radio-frequency transmission line, in which the first metal ground layer has a first through hole therethrough in the thickness direction, the second metal ground layer has a second through hole therethrough in the thickness direction, the first through hole and the second through hole are opposite in the thickness direction, a portion of the radio-frequency transmission line opposite the first through hole in the thickness direction constitutes the coplanar waveguide segment, and the band-shaped line segment of the radio-frequency transmission line is staggered with the first through hole in the thickness direction.

What is claimed is:

1. An electronic device, comprising:
a first body and a second body, wherein the first body and the second body are rotatably connected relative to each other through a pivot shaft having a metal portion, the first body comprising a first motherboard, the second body comprising a second motherboard; and
a radio-frequency transmission line having a first end coupled to the first motherboard and a second end coupled to the second motherboard, the radio-frequency transmission line comprising at least one band-shaped line segment and at least two coplanar waveguide segments, the at least one band-shaped line segment being coupled to the at least two coplanar waveguide segments, wherein one band-shaped line segment of the at least one band-shaped line segment is located between two coplanar waveguide segments of the at least two coplanar waveguide segments in an extending direction of the radio-frequency transmission line, the one band-shaped line segment of the at least one band-shaped line segment is coupled to the pivot shaft to retain stationary relative to the pivot shaft, and the at least two coplanar waveguide segments are spaced apart from the metal portion.

2. The electronic device according to claim 1, wherein the radio-frequency transmission line comprises 2N+1 band-shaped line segments and 2N coplanar waveguide segments arranged alternately and connected sequentially in the extending direction, wherein N is an integer greater than or equal to 1, each coplanar waveguide segment is located between two adjacent band-shaped line segments in the extending direction, one of the band-shaped line segments is coupled to the first motherboard, and another of the band-shaped line segments is coupled to the second motherboard.

3. The electronic device according to claim 2, wherein
the band-shaped line segments comprise a first band-shaped line segment, a second band-shaped line segment and a third band-shaped line segment arranged sequentially in the extending direction, the first band-shaped line segment is coupled to the first motherboard, the third band-shaped line segment is coupled to the second motherboard, and the second band-shaped line segment is coupled to the pivot shaft to retain stationary relative to the pivot shaft, wherein the pivot shaft is located between the first band-shaped line segment and the third band-shaped line segment in the extending direction;
the coplanar waveguide segments comprising:
a first coplanar waveguide segment located between the first band-shaped line segment and the second band-shaped line segment in the extending direction, the first coplanar waveguide segment being coupled to each of the first band-shaped line segment and the second band-shaped line segment; and
a second coplanar waveguide segment located between the second band-shaped line segment and the third band-shaped line segment in the extending direction, the second coplanar waveguide segment being coupled to each of the second band-shaped line segment and the third band-shaped line segment, the first coplanar waveguide segment and the second coplanar waveguide segment being spaced apart from the metal portion of the pivot shaft.

4. The electronic device according to claim 3, wherein each of the first coplanar waveguide segment and the second coplanar waveguide segment has a length less than or equal to a first preset value.

5. The electronic device according to claim 2, wherein
the band-shaped line segments comprise a first band-shaped line segment, a second band-shaped line segment, a third band-shaped line segment, a fourth band-shaped line segment and a fifth band-shaped line segment arranged sequentially in the extending direction, the first band-shaped line segment is coupled to the first motherboard, the fifth band-shaped line segment is coupled to the second motherboard, and the third band-shaped line segment is coupled to the pivot shaft to retain stationary relative to the pivot shaft, wherein the pivot shaft is located between the first band-shaped line segment and the fifth band-shaped line segment in the extending direction;
the coplanar waveguide segments comprising:
a first coplanar waveguide segment located between the first band-shaped line segment and the second band-shaped line segment in the extending direction, the first coplanar waveguide segment being coupled to each of the first band-shaped line segment and the second band-shaped line segment;
a second coplanar waveguide segment located between the second band-shaped line segment and the third band-shaped line segment in the extending direction, the second coplanar waveguide segment being coupled to each of the second band-shaped line segment and the third band-shaped line segment;
a third coplanar waveguide segment located between the third band-shaped line segment and the fourth band-shaped line segment in the extending direction, the third coplanar waveguide segment being coupled to each of the third band-shaped line segment and the fourth band-shaped line segment; and
a fourth coplanar waveguide segment located between the fourth band-shaped line segment and the fifth band-shaped line segment in the extending direction, the fourth coplanar waveguide segment being coupled to each of the fourth band-shaped line segment and the fifth band-shaped line segment, wherein the first coplanar waveguide segment, the second coplanar waveguide segment, the third coplanar waveguide segment and the fourth coplanar waveguide segment are spaced apart from the metal portion of the pivot shaft.

6. The electronic device according to claim 5, wherein each of the first coplanar waveguide segment, the second coplanar waveguide segment, the third coplanar waveguide segment and the fourth coplanar waveguide segment has a length greater than or equal to a second preset value and less than or equal to a third preset value.

7. The electronic device according to claim 5, wherein each of the second band-shaped line segment and the fourth band-shaped line segment has a length less than or equal to a fourth preset value.

8. The electronic device according to claim 1, wherein each coplanar waveguide segment has a metal trace layer, the metal trace layer comprising:
a base part having a width greater than a width of a metal trace layer of the band-shaped line segment;
a first transition part having a first end part coupled to the metal trace layer of a corresponding band-shaped line segment and a second end part coupled to the base part, wherein the first end part of the first transition part has a width equal to the width of the metal trace layer of the corresponding band-shaped line segment, the second end part of the first transition part has a width equal to the width of the base part, the first transition part has a width increasing in the extending direction and along a direction towards the base part; and
a second transition part having a first end part coupled to the metal trace layer of a corresponding band-shaped line segment and a second end part coupled to the base part, the base part being located between the first transition part and the second transition part in the extending direction, wherein the first end part of the second transition part has a width equal to the width of the metal trace layer of the corresponding band-shaped line segment, the second end part of the second transition part has a width equal to the width of the base part, the second transition part has a width decreasing in the extending direction and along a direction away from the base part.

9. The electronic device according to claim 8, wherein the width of the first transition part increases gradually in the extending direction and along the direction towards the base part; and the width of the second transition part decreases gradually in the extending direction and along the direction away from the base part.

10. The electronic device according to claim 1, wherein the radio-frequency transmission line comprises:
   a first metal ground assembly comprising a first polyimide layer and a first metal ground layer arranged on the first polyimide layer;
   a second metal ground assembly comprising a second polyimide layer and a second metal ground layer arranged on the second polyimide layer; and
   a metal trace assembly comprising a third polyimide layer and a metal trace layer arranged on the third polyimide layer, the first metal ground layer, the first polyimide layer, the metal trace layer, the third polyimide layer, the second metal ground layer and the second polyimide layer being arranged sequentially in a thickness direction of the radio-frequency transmission line, wherein the first metal ground layer has a first through hole therethrough in the thickness direction, the second metal ground layer has a second through hole therethrough in the thickness direction, the first through hole and the second through hole are opposite in the thickness direction, a portion of the radio-frequency transmission line opposite the first through hole in the thickness direction constitutes the coplanar waveguide segment, and the band-shaped line segment of the radio-frequency transmission line is staggered with the first through hole in the thickness direction.

11. A radio-frequency transmission line comprising:
   at least one band-shaped line segment and at least two coplanar waveguide segments, one band-shaped line segment of the at least one band-shaped line segment being located between two coplanar waveguide segments of the at least two coplanar waveguide segments in an extending direction of the radio-frequency transmission line, the at least one band-shaped line segment being coupled to the at least two coplanar waveguide segments in the extending direction.

12. The radio-frequency transmission line according to claim 11, wherein the radio-frequency transmission line comprises 2N+1 band-shaped line segments and 2N coplanar waveguide segments arranged alternately and connected sequentially in the extending direction, wherein N is an integer greater than or equal to 1, each coplanar waveguide segment is located between two adjacent band-shaped line segments in the extending direction.

13. The radio-frequency transmission line according to claim 12, wherein
   the band-shaped line segments comprises a first band-shaped line segment, a second band-shaped line segment and a third band-shaped line segment arranged sequentially in the extending direction;
   the coplanar waveguide segments comprising:
   a first coplanar waveguide segment located between the first band-shaped line segment and the second band-shaped line segment in the extending direction, the first coplanar waveguide segment being coupled to each of the first band-shaped line segment and the second band-shaped line segment; and
   a second coplanar waveguide segment located between the second band-shaped line segment and the third band-shaped line segment in the extending direction, the second coplanar waveguide segment being coupled to each of the second band-shaped line segment and the third band-shaped line segment.

14. The radio-frequency transmission line according to claim 13, wherein each of the first coplanar waveguide segment and the second coplanar waveguide segment has a length less than or equal to a first preset value.

15. The radio-frequency transmission line according to claim 12, wherein
   the band-shaped line segments comprises a first band-shaped line segment, a second band-shaped line segment, a third band-shaped line segment, a fourth band-shaped line segment and a fifth band-shaped line segment arranged sequentially in the extending direction;
   the coplanar waveguide segments comprising:
   a first coplanar waveguide segment located between the first band-shaped line segment and the second band-shaped line segment in the extending direction, the first coplanar waveguide segment being coupled to each of the first band-shaped line segment and the second band-shaped line segment;
   a second coplanar waveguide segment located between the second band-shaped line segment and the third band-shaped line segment in the extending direction, the second coplanar waveguide segment being coupled to each of the second band-shaped line segment and the third band-shaped line segment;
   a third coplanar waveguide segment located between the third band-shaped line segment and the fourth band-shaped line segment in the extending direction, the third coplanar waveguide segment being coupled to each of the third band-shaped line segment and the fourth band-shaped line segment; and
   a fourth coplanar waveguide segment located between the fourth band-shaped line segment and the fifth band-shaped line segment in the extending direction, the fourth coplanar waveguide segment being coupled to each of the fourth band-shaped line segment and the fifth band-shaped line segment.

16. The radio-frequency transmission line according to claim 15, wherein each of the first coplanar waveguide segment, the second coplanar waveguide segment, the third coplanar waveguide segment and the fourth coplanar waveguide segment has a length greater than or equal to a second preset value and less than or equal to a third preset value.

17. The radio-frequency transmission line according to claim 15, wherein each of the second band-shaped line segment and the fourth band-shaped line segment has a length less than or equal to a fourth preset value.

18. The radio-frequency transmission line according to claim 11, wherein each coplanar waveguide segment has a metal trace layer, the metal trace layer comprising:
   a base part having a width greater than a width of a metal trace layer of the band-shaped line segment;
   a first transition part having a first end part coupled to the metal trace layer of a corresponding band-shaped line segment and a second end part coupled to the base part, wherein the first end part of the first transition part has a width equal to the width of the metal trace layer of the corresponding band-shaped line segment, the second end part of the first transition part has a width equal to the width of the base part, the first transition part has a width increasing in the extending direction and along a direction towards the base part; and
   a second transition part having a first end part coupled to the metal trace layer of a corresponding band-shaped line segment and a second end part coupled to the base part, the base part being located between the first transition part and the second transition part in the extending direction, wherein the first end part of the second transition part has a width equal to the width of the metal trace layer of the corresponding band-shaped line segment, the second end part of the second transition part has a width equal to the width of the base part, the second transition part has a width decreasing in the extending direction and along a direction away from the base part.

19. The radio-frequency transmission line according to claim 18, wherein the width of the first transition part increases gradually in the extending direction and along the direction towards the base part; and the width of the second transition part decreases gradually in the extending direction and along the direction away from the base part.

20. The radio-frequency transmission line according to claim 11,
further comprising:
a first metal ground assembly comprising a first polyimide layer and a first metal ground layer arranged on the first polyimide layer;
a second metal ground assembly comprising a second polyimide layer and a second metal ground layer arranged on the second polyimide layer; and
a metal trace assembly comprising a third polyimide layer and a metal trace layer arranged on the third polyimide layer, the first metal ground layer, the first polyimide layer, the metal trace layer, the third polyimide layer, the second metal ground layer and the second polyimide layer being arranged sequentially in a thickness direction of the radio-frequency transmission line, wherein the first metal ground layer has a first through hole therethrough in the thickness direction, the second metal ground layer has a second through hole therethrough in the thickness direction, the first through hole and the second through hole are opposite in the thickness direction, a portion of the radio-frequency transmission line opposite the first through hole in the thickness direction constitutes the coplanar waveguide segment, and the band-shaped line segment of the radio-frequency transmission line is staggered with the first through hole in the thickness direction.

* * * * *